US 6,689,623 B2

(12) United States Patent
Hong

(10) Patent No.: US 6,689,623 B2
(45) Date of Patent: Feb. 10, 2004

(54) METHOD FOR FORMING A CAPACITOR

(75) Inventor: Kwon Hong, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 10/236,311

(22) Filed: Sep. 6, 2002

(65) Prior Publication Data

US 2003/0048593 A1 Mar. 13, 2003

(30) Foreign Application Priority Data

Sep. 12, 2001 (KR) .................................. 2001-56136

(51) Int. Cl.[7] ................................................ H01G 7/06
(52) U.S. Cl. .......................................... 438/3; 438/240
(58) Field of Search ........................... 438/3, 238–240, 438/253–256, 381, 396–399

(56) References Cited

U.S. PATENT DOCUMENTS

| 5,619,393 | A | * | 4/1997 | Summerfelt et al. ...... 361/321.1 |
| 6,011,284 | A | | 1/2000 | Katori et al. ............... 257/295 |
| 6,096,391 | A | | 8/2000 | Muffoletto et al. ......... 427/580 |
| 6,110,529 | A | | 8/2000 | Gardiner et al. ............ 427/250 |
| 6,127,277 | A | | 10/2000 | DeOrnellas et al. ........ 438/714 |
| 6,144,060 | A | | 11/2000 | Park et al. .................. 257/310 |
| 6,165,623 | A | | 12/2000 | Fife et al. ................... 428/472 |
| 6,190,496 | B1 | | 2/2001 | DeOrnellas et al. ........ 156/345 |
| 6,358,810 | B1 | * | 3/2002 | Dornfest et al. ............ 438/396 |
| 6,521,494 | B2 | * | 2/2003 | Matsui et al. ............... 438/239 |

FOREIGN PATENT DOCUMENTS

| KR | 1998-14897 | 5/1998 |
| KR | 1999-27044 | 4/1999 |

OTHER PUBLICATIONS

Notice of Preliminary Rejection issued from the Korean Intellectual Property Office in counterpart Application No. 2001-56136, and English-language translation thereof (May 27, 2003).

* cited by examiner

Primary Examiner—Jey Tsai
(74) Attorney, Agent, or Firm—Marshall, Gerstein & Borun LLP

(57) ABSTRACT

The disclosure provides a capacitor including a lower electrode, a surface of which can be formed of Pt, and an inner part of which can be formed of metal having good antioxidant properties. The inner part of the lower electrode can be formed by depositing Ru or Ir with an electro plating process. It is possible to improve the leakage current characteristics by forming the surface of the lower electrode with Pt. Also it is possible to perform a thermal treatment at a high temperature in an oxygen atmosphere, because the inner part of the lower electrode resists or prevents diffusion of oxygen, so that a high dielectric layer can be obtained.

10 Claims, 4 Drawing Sheets

METHOD FOR FORMING A CAPACITOR

BACKGROUND

1. Field of the Invention

The invention relates to a semiconductor device and a method for forming a semiconductor device. More particularly, the invention relates to a capacitor for a semiconductor device and a method for forming the capacitor.

2. Brief Description of Related Technology

Each of a dynamic random access memory (DRAM), which is the most widely used semiconductor memory device, and a ferroelectric random access memory (FeRAM), which has attracted much attention recently, has a unit cell structure consisting of one transistor and one capacitor. The unit cell structure of the DRAM and FeRAM is a superior structure from an integration respect.

The capacitor of such semiconductor devices has a stacked structure including an upper electrode, a dielectric layer for charge storing, and a lower electrode. In a DRAM and a FeRAM, the capacitor is coupled to one active region of a transistor through a plug formed of doped polysilicon. The charge stored in the capacitor flow into a bit line through a channel of the transistor and another active region of the transistor.

Methods for forming a highly integrated DRAM or FeRAM, employing high dielectric material or ferroelectric material for forming a capacitor dielectric layer, respectively, are described below. As used herein, the term "dielectric material" can include a ferroelectric material and "dielectric layer" can include a ferroelectric layer.

An interlayer insulating layer and an etch barrier layer are formed on a semiconductor substrate on which a transistor and a bit line are formed. Thereafter, the interlayer insulating layer and the etch barrier layer are selectively etched to form a contact hole exposing an active region of the transistor, and a polysilicon plug is then formed in the contact hole to fill a portion of the contact hole.

Subsequently, a titanium layer is deposited on the substrate and a rapid thermal process is performed to form a titanium suicide ($TiSi_x$) layer by causing a reaction between silicon in the polysilicon plug and titanium in the titanium layer. The titanium layer remaining on the interlayer insulating layer is removed by a wet etching process. The $TiSi_x$ layer is an ohmic contact layer reducing contact resistance between the polysilicon plug and a diffusion barrier layer to be formed over the polysilicon plug.

Next, a TiN layer is formed on the $TiSi_x$ layer and the etch barrier layer. The TiN layer is then removed by a polishing process or an etching process until the surface of the etch barrier layer is exposed to leave the TiN layer only in the contact hole. The TiN layer plays the role of a diffusion barrier layer to prevent oxygen diffusing to the polysilicon plug or the substrate through a lower electrode of a capacitor during thermal treatment. Such a thermal treatment can be a part of a process for forming a high dielectric layer or a ferroelectric layer, for example.

Thereafter, a lower electrode layer, a high dielectric layer (or a ferroelectric layer), and an upper electrode layer are deposited in order and pattern to form a capacitor. It is difficult to use polysilicon as an electrode material. Instead of polysilicon, noble metals, such as platinum ("Pt"), iridium ("Ir"), and ruthenium ("Ru"); conductive oxides, such as $RuO_2$ and $IrO_2$; and conductive compounds such as TiN can be used to form the metal/insulator/metal("MIM") structure of a capacitor.

A high dielectric layer made of $SrTiO_3$ ("STO") or $(Ba, Sr)TiO_3$ ("BST"), and a ferroelectric layer made of $Pb(Zr, Ti)O_3$ ("PZT"), $SrBi_2Ta_2O_9$ ("SBT"), $(Sr_xBi_{2-y})(Ta_{1-z}Nb_z)_2O_9$ ("SBTN"), or $(Bi, La)TiO_3$ ("BLT") are generally formed at very high temperature (e.g., from about 600° C. to about 1000° C.) in an oxygen atmosphere.

When depositing a dielectric layer or performing a subsequent thermal treatment in an oxygen atmosphere, oxygen can diffuse into parts of the semiconductor device that are under the capacitor and cause problems such as formation of an isolation layer or a resistance material. For example, an isolation layer including $SiO_2$ can be formed on the surface of the polysilicon plug by diffused oxygen. Moreover, in the case of forming a lower electrode on a polysilicon plug using metal, such as Pt, a resistance material, such as PtSi, is easily formed by the reaction of the metal and silicon at a temperature above about 250° C., for example. Therefore, the problem of increased resistance is possible.

To ameliorate the problem of resistance increase, a diffusion barrier layer is formed of TiN, as mentioned above. However, subsequent processing temperatures are limited to about 450° C. even if the barrier layer is formed of TiN, due to the potential for oxidizing TiN. Accordingly, a barrier material capable of effectively preventing the polysilicon being oxidized is desired. A triatomic barrier layer material, such as TiAlN, TiSiN, or TaSiN, is oxidized at a temperature as much as about 50° C. to about 100° C. higher than TiN. However, such a triatomic barrier layer is also easily oxidized at a temperature of over 550° C. That is, an insulating layer, such as a $TiO_2$ layer, an $Al_2O_3$ layer, or a $SiO_2$ layer, is formed on the surface of the triatomic barrier layer because oxygen diffused through the lower electrode reacts with the Ti-based nitride layer or the polysilicon plug during a process for forming a capacitor.

To secure the dielectric quality of a high dielectric layer, such as a layer made of STO or BST, and a ferroelectric layer, such as a layer made of PZT, SBT, SBTN, or BLT, the barrier layer preferably will resist or prevent oxidation of the polysilicon and resist or prevent oxidation of itself at a temperature over about 600° C.

SUMMARY

It is, therefore, desirable to provide a semiconductor device capable of resisting or preventing the diffusion of oxygen past a lower electrode during thermal processing, and a method for fabricating such a semiconductor device.

Disclosed herein is a method of forming a capacitor, including the steps of: forming a lower electrode on a substrate, the lower electrode including a metal pattern and a layer including Pt covering an upper surface and sidewalls of the metal pattern, wherein the metal pattern is formed of a material having good antioxidant properties (e.g., capable of forming a conductive oxide); forming a dielectric layer on the lower electrode; and forming an upper electrode on the dielectric layer.

Also disclosed herein is a capacitor, including: a lower electrode formed on a substrate, wherein the lower electrode includes a metal pattern and a layer including Pt covering an upper surface and sidewalls of the metal pattern, and wherein the metal pattern is formed of a material having good antioxidant properties (e.g., capable of forming a conductive oxide); a dielectric layer formed on the lower electrode; and an upper electrode formed on the dielectric layer.

A surface of the lower electrode can be formed of Pt having a work function that has a high difference with the work function of the dielectric material. An inner part of the lower electrode is formed of metal, for example a metal which forms a conductive oxide material, being a good antioxidant. The inner part of the lower electrode can be formed by depositing metal, such as Ru or Ir, by electro plating, for example.

BRIEF DESCRIPTION OF THE DRAWINGS

The above and other aspects of the disclosure will become apparent from the following description given in conjunction with the accompanying drawings, in which.

DETAILED DESCRIPTION

Figure 1:
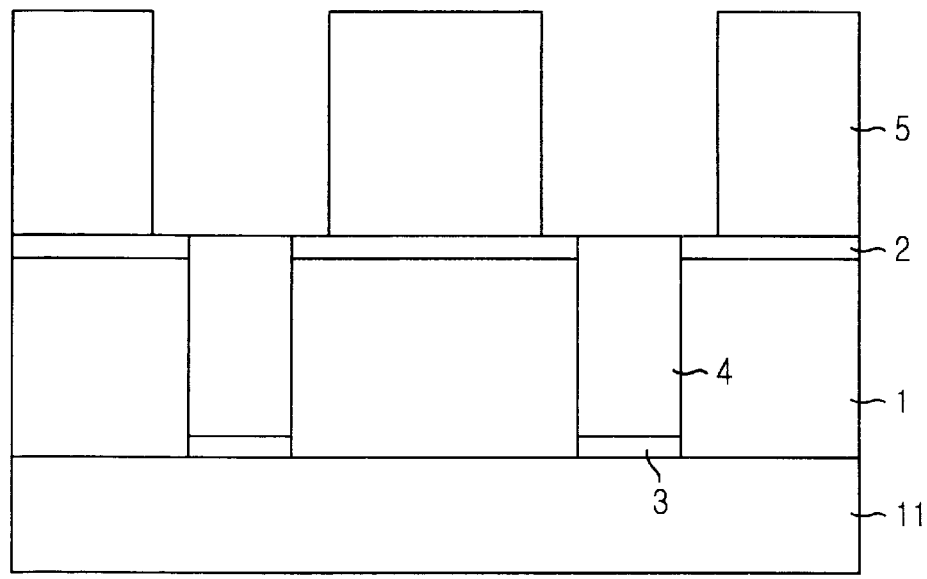
FIGS. 1 to 8 are cross-sectional views illustrating a method for fabricating a semiconductor device in accordance with the disclosure.

Referring to FIG. 1, an interlayer insulating layer 1 is formed with an oxide layer on a substrate 11 undergone predetermined processes, and a SiON layer 2, of which etch selectivity is higher than that of the oxide layer, is formed on the interlayer insulating layer 1. Thereafter, the SiON layer 2 and the interlayer insulating layer 1 are selectively etched to form a contact hole exposing the substrate 11. Next, a polysilicon plug (not shown) is formed in the contact hole for forming a vertical interconnection between the substrate 11 and a capacitor to be formed.

Subsequently, a titanium layer is deposited to a thickness of about 100 Å to about 300 Å, and then a rapid thermal treatment (RTP) is carried out at a temperature of about 650° C. to about 800° C. to form a titanium silicide layer 3 for reducing contact resistance between the polysilicon plug and a barrier metal layer later to be formed on the polysilicon plug. Un-reacted titanium from the titanium layer is removed by a wet etch process. Next, a titanium nitride layer 4 is formed as the metal barrier layer on the substrate 11, and the titanium nitride layer 4 is flattened, for example by a chemical mechanical polishing (CMP) process, to reach substantially the same height as the SiON layer 2. Various triatomic materials, such as TiSiN, TiAlN, and TaSiN, can be used to form a metal barrier layer instead of titanium nitride.

Thereafter, a sacrificial layer 5 (e.g., a silicon oxide layer, a phosphosilicate glass (PSG) layer, and the like) for forming a lower electrode of a capacitor is deposited and selectively etched to expose the titanium nitride layer 4. Preferably, a photolithography, exposing, and etching process is used.

Figure 2:
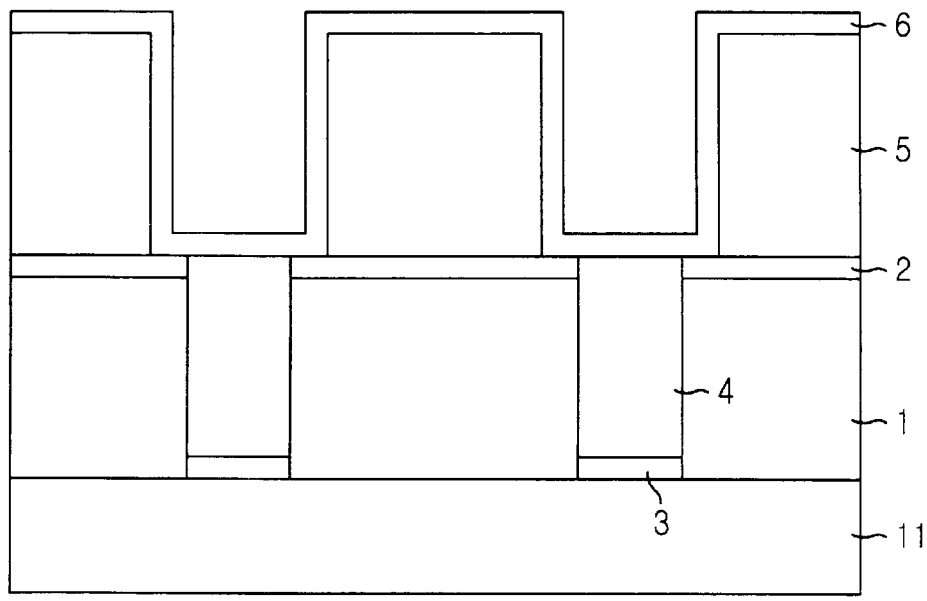

Referring to FIG. 2, a Pt seed layer 6 is formed to a thickness of about 100 Å to about 300 Å, with a chemical vapor deposition (CVD) method, for example.

Figure 3:
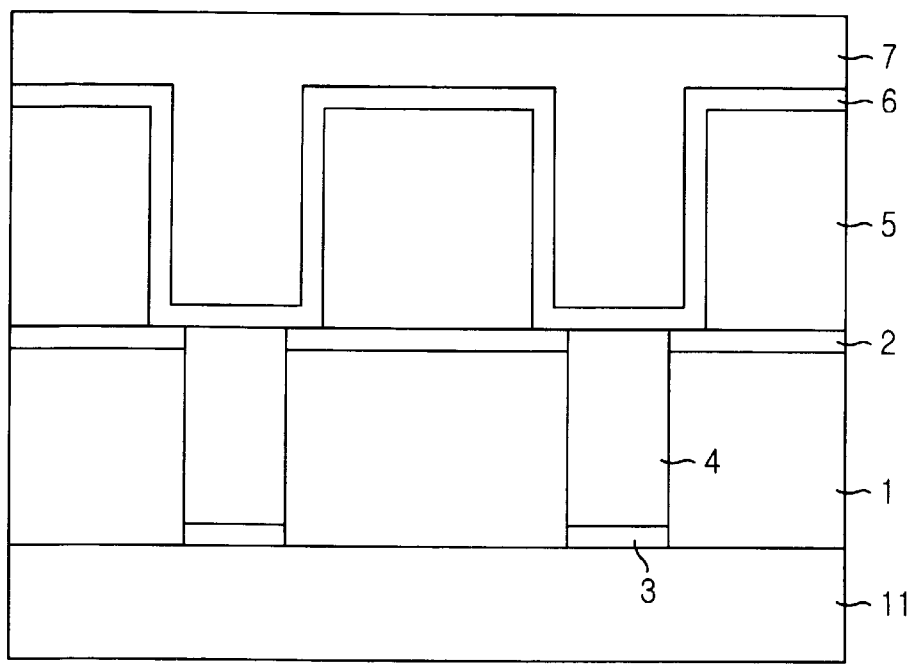

Referring to FIG. 3, a metal layer 7 for a lower electrode of a capacitor is formed, for example by depositing a metal such as Ru or Ir with a CVD method.

Figure 4:
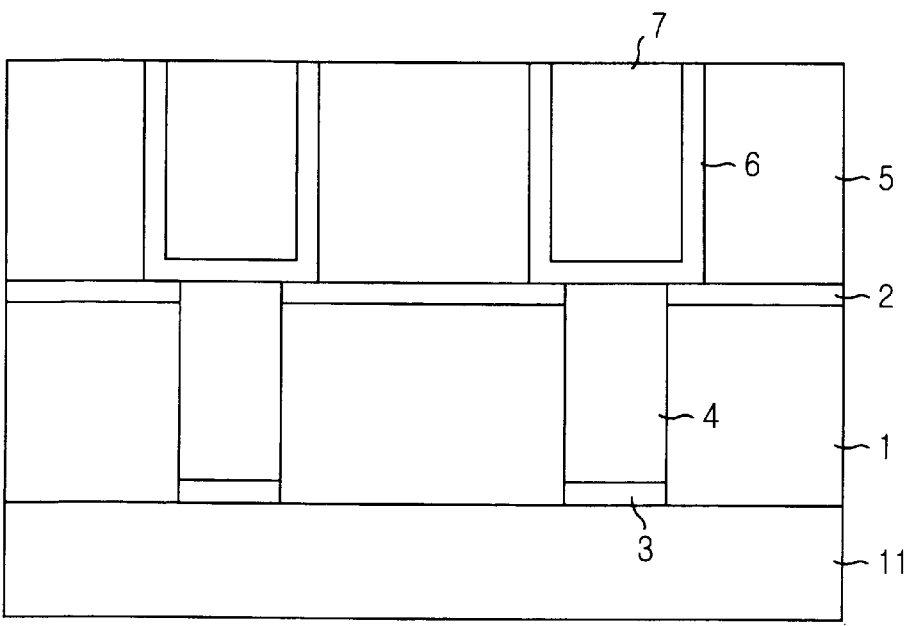

Referring to FIG. 4, portions of the metal layer 7 and the seed layer 6 are removed, for example by CMP, until the surface of the sacrificial layer 5 is exposed.

Figure 5:
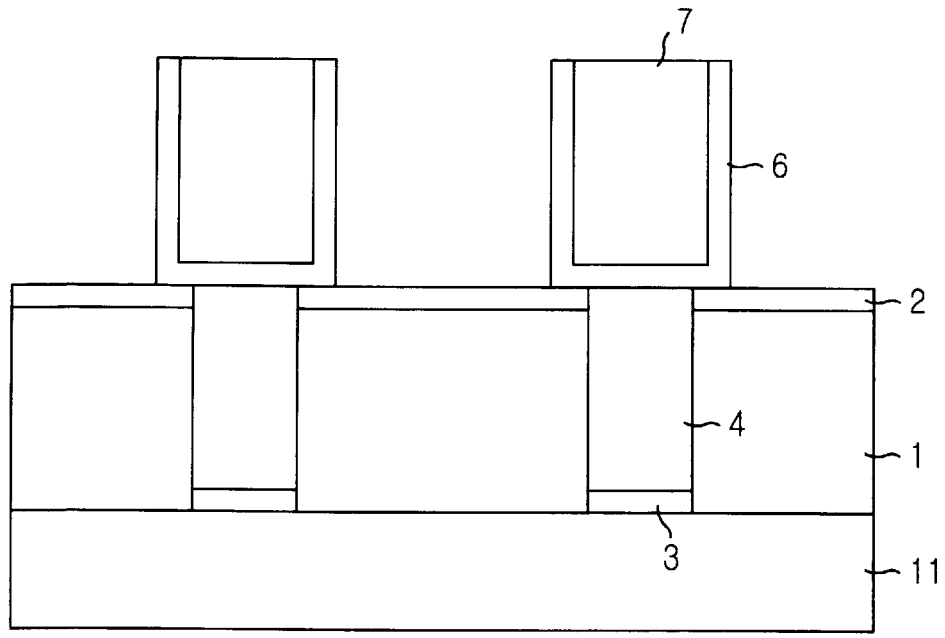

Referring to FIG. 5, the sacrificial layer 5 is removed.

Figure 6:
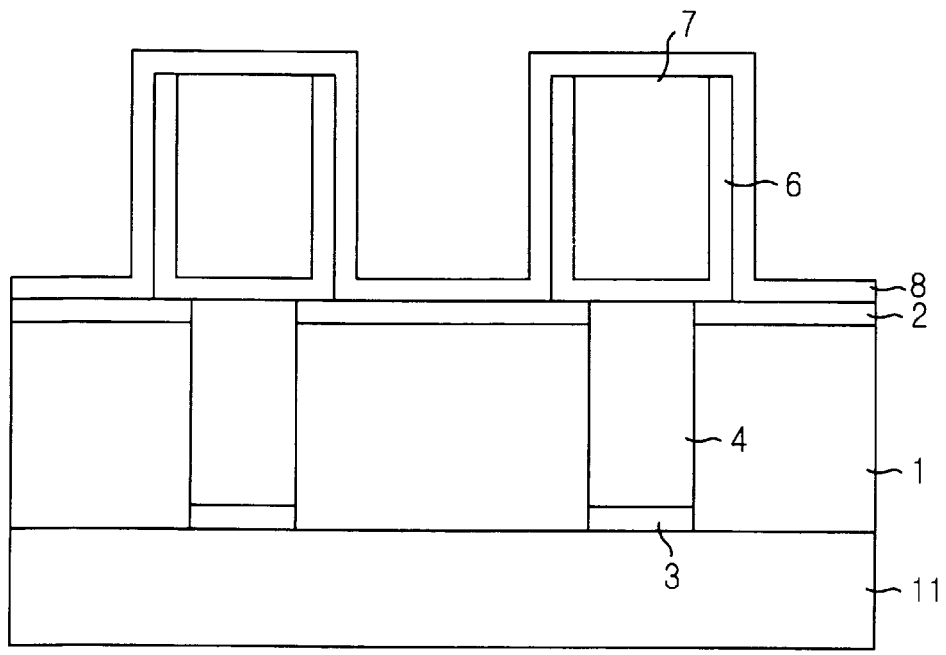

Referring to FIG. 6, a Pt layer 8 is formed on the entire surface of the substrate.

Figure 7:
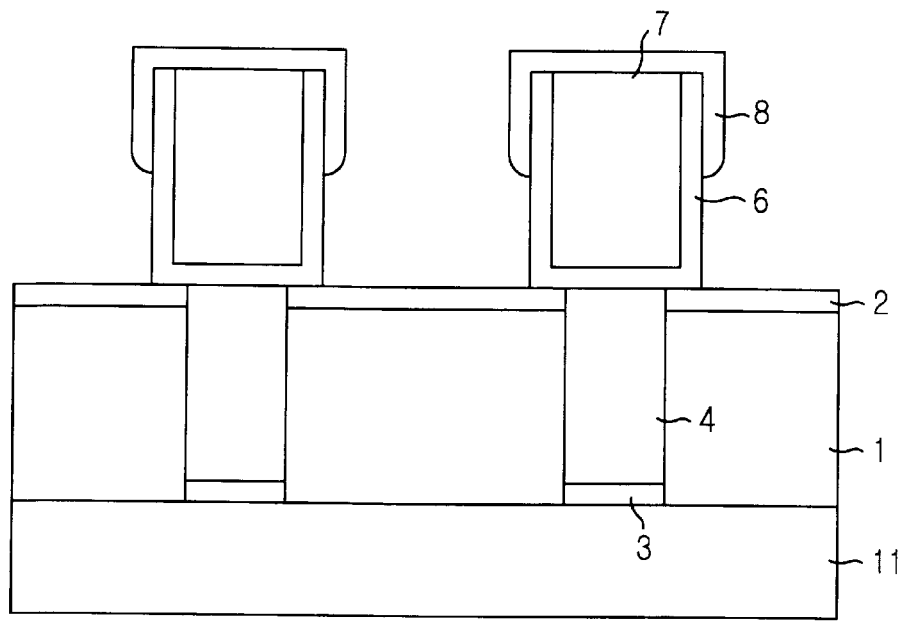

Referring to FIG. 7, a process, such as a blanket etch-back process using a reactive ion etching method, is carried out to remove a portion of the pt layer 8 and leave the Pt layer 8 remaining on the upper surface of the metal layer 7.

Figure 8:
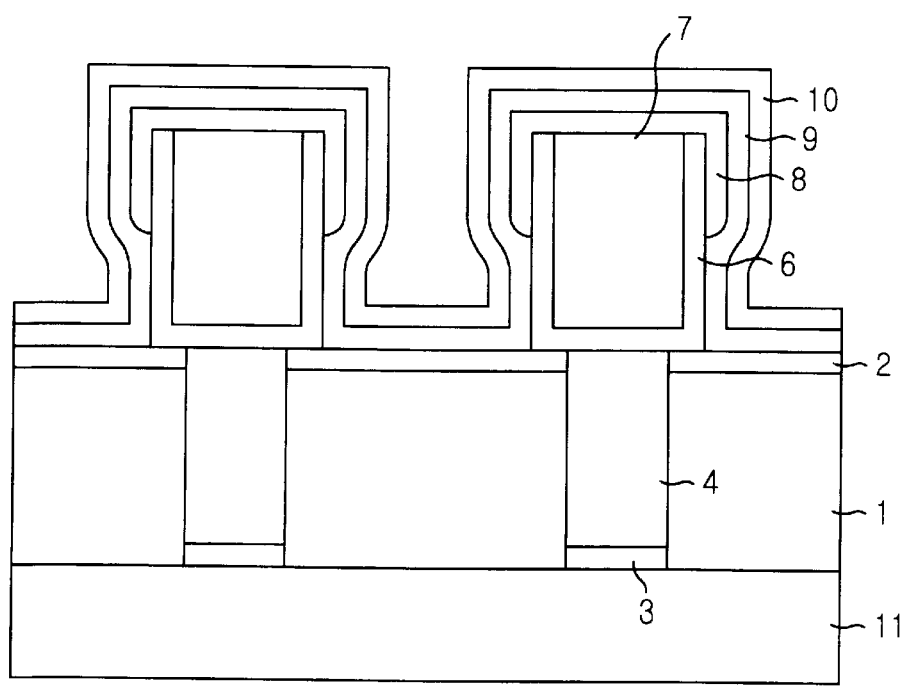

Referring to FIG. 8, a dielectric layer 9 is formed, for example with an atomic layer deposition method or a metal organic chemical vapor deposition method. In the case of forming a dynamic random access memory, the dielectric layer 9 preferably is formed of a high dielectric material, such as $Ta_2O_5$ ("TaON"), STO, SBT, or BST; and in case of forming a ferroelectric random access memory, the dielectric layer 9 preferably is formed of a ferroelectric material, such as PZT, SBT, SBTN, or BLT. Thereafter, the dielectric layer 9 is crystallized, for example by a rapid thermal nitridation ("RTN") or a rapid thermal nitr-oxidation ("RTNO") process at a temperature of about 650° C. to about 750° C. for about 10 seconds to about 180 seconds.

Subsequently, a top electrode 10 is formed, for example with a CVD method, to a thickness of about 500 Å to about 1000 Å. The top electrode 10 preferably is formed of a metal selected from the group consisting of Ru, Ir and Pt.

In the above-described example, a seed layer 6 is formed; however the step of forming a seed layer can be omitted. That is, the lower electrode can be obtained by forming a metal pattern without a seed layer and by forming a Pt layer on an upper surface and sidewalls of the metal pattern.

By forming the surface and the inner part of the lower electrode of the capacitor with Pt and a metal which forms a conductive metal oxide, respectively, it is possible to perform the thermal treatment for crystallizing a dielectric layer at a higher temperature, for example as much as about 150° C. to about 200° C., compared to the case of forming the lower electrode only with a TiN layer.

Therefore, several advantages can be achieved by various examples of a process according to the disclosure. First, it is possible to reduce leakage current, for example by the use of a material such as Pt for forming the surface of the lower electrode. It is also possible to form a dielectric layer having a high dielectric constant, for example because it is possible to perform thermal treatment for crystallizing a dielectric layer at a temperature as much as 150° C. to about 200° C. higher than the case when a lower electrode is formed only with a TiN layer. Thus, the process burden due to the capacitor formation process can be minimized. Finally, it is also possible to perform a thermal treatment at a high temperature in an oxygen atmosphere, because the inner part of the lower electrode prevents oxygen from diffusing, so that a high dielectric layer can be obtained.

Although the examples of the disclosure have been described for illustrative purposes, those skilled in the art will appreciate that various modifications, additions and substitutions are possible, without departing from the scope and spirit of the disclosure.

What is claimed is:

1. A method for forming a capacitor, comprising the steps of:

forming a lower electrode including a metal pattern having an upper surface and sidewalls, a Pt seed layer for reducing leakage current on the sidewalls of the metal pattern, and a layer comprising Pt covering the upper surface of the metal pattern, wherein the metal pattern is formed of a material capable of forming a conductive oxide;

forming a dielectric layer on the low electrode; and forming an upper electrode on the dielectric layer.

2. The method as recited in claim 1, wherein the step of forming the lower electrode includes the steps of:

forming a sacrificial layer on the substrate;

forming a contact hole by selectively etching the sacrificial layer;

forming the Pt seed layer comprising Pt in the contact hole;

filling the contact hole with a metal layer for the metal pattern;

removing the sacrificial layer, whereby the metal pattern and the Pt seed layer are exposed; and forming the layer comprising Pt on the upper surface of the metal pattern and over at least part of the Pt seed layer.

3. The method as recited in claim 2, comprising forming the metal layer with an electro plating process.

4. The method as recited in claim 2, wherein the step of forming the layer comprising Pt includes the steps of:

forming the layer comprising Pt on the metal pattern with a sputtering method; and performing a blanket etch back process with a reactive ion etching process, whereby the layer comprising Pt remains on the upper surface and sidewalls of the metal pattern.

5. The method as recited in claim 2, comprising forming the seed layer to a thickness of about 100 Å to about 300 Å.

6. The method as recited in claim 2, comprising forming the seed layer with a chemical vapor deposition method.

7. The method as recited in claim 2, comprising forming the metal pattern comprising a metal selected from the group consisting of Ru and Ir.

8. The method as recited in claim 1, wherein the capacitor includes:

the lower electrode formed on the substrate, wherein the lower electrode includes the metal pattern and the layer comprising Pt covering the upper surface and sidewalls of the metal pattern, and wherein the metal pattern is formed of a material capable of forming a conductive oxide;

the dielectric layer formed on the lower electrode; and the upper electrode formed on the dielectric layer.

9. The method as recited in claim 8, wherein the capacitor further includes the seed layer comprising Pt between the substrate and the metal pattern.

10. The method as recited in claim 9, wherein the capacitor includes the metal pattern composed of a metal selected from the group consisting of Ru and Ir.

* * * * *

UNITED STATES PATENT AND TRADEMARK OFFICE
CERTIFICATE OF CORRECTION

PATENT NO. : 6,689,623 B2
DATED : February 10, 2004
INVENTOR(S) : Kwon Hong

It is certified that error appears in the above-identified patent and that said Letters Patent is hereby corrected as shown below:

<u>Title page, Item [54] and Column 1, line 1,</u>
Title, delete "METHOD FOR FORMING A CAPACITOR" and replace with -- CAPACITOR AND METHOD FOR FORMING A CAPACITOR" --.

<u>Column 4,</u>
Line 59, delete "low" and replace with -- lower --.

Signed and Sealed this

Fourteenth Day of September, 2004

JON W. DUDAS
*Director of the United States Patent and Trademark Office*